United States Patent [19]
Yamazaki et al.

[11] Patent Number: 5,858,823
[45] Date of Patent: Jan. 12, 1999

[54] SEMICONDUCTOR CIRCUIT FOR ELECTRO-OPTICAL DEVICE AND METHOD OF MANUFACTURING THE SAME

[75] Inventors: Shunpei Yamazaki, Tokyo; Satoshi Teramoto, Kanagawa, both of Japan

[73] Assignee: Semiconductor Energy Laboratory Co., Ltd., Kanagawa, Japan

[21] Appl. No.: 769,113

[22] Filed: Dec. 18, 1996

Related U.S. Application Data

[62] Division of Ser. No. 520,079, Aug. 28, 1995.

[30] Foreign Application Priority Data

Aug. 29, 1994 [JP] Japan .................................. 6-227358
Aug. 31, 1994 [JP] Japan .................................. 6-230647

[51] Int. Cl.$^6$ ...................................................... M01L 21/00
[52] U.S. Cl. ................................................ 438/166; 117/8
[58] Field of Search ................................. 438/166; 117/8

[56] References Cited

U.S. PATENT DOCUMENTS

| | | |
|---|---|---|
| 5,147,826 | 9/1992 | Liu et al. . |
| 5,275,851 | 1/1994 | Fonash et al. . |
| 5,403,772 | 4/1995 | Zhang et al. . |
| 5,426,064 | 6/1995 | Zhang et al. . |
| 5,481,121 | 1/1996 | Zhang et al. . |
| 5,488,000 | 1/1996 | Zhang et al. . |
| 5,492,843 | 2/1996 | Adachi et al. . |
| 5,501,989 | 3/1996 | Takayama et al. . |
| 5,508,533 | 4/1996 | Takemura . |
| 5,529,937 | 6/1996 | Zhang et al. . |
| 5,534,716 | 7/1996 | Takemura . |
| 5,543,352 | 8/1996 | Ohtani et al. . |
| 5,543,636 | 8/1996 | Yamazaki . |
| 5,563,426 | 10/1996 | Zhang et al. . |
| 5,569,610 | 10/1996 | Zhang .................................. 438/166 |
| 5,569,936 | 10/1996 | Zhang et al. . |
| 5,580,792 | 12/1996 | Zhang et al. . |
| 5,585,291 | 12/1996 | Ohtani et al. . |
| 5,589,694 | 12/1996 | Takayama et al. . |
| 5,595,923 | 1/1997 | Zhang et al. . |
| 5,595,944 | 1/1997 | Zhang et al. . |
| 5,604,360 | 2/1997 | Zhang et al. . |
| 5,605,846 | 2/1997 | Ohtani et al. . |
| 5,606,179 | 2/1997 | Yamazaki et al. . |
| 5,608,232 | 3/1997 | Yamazaki et al. . |
| 5,612,250 | 3/1997 | Ohtani et al. . |
| 5,614,426 | 3/1997 | Funada et al. . |
| 5,614,733 | 3/1997 | Zhang et al. . |
| 5,616,506 | 4/1997 | Takemura . |
| 5,620,910 | 4/1997 | Teramoto . |
| 5,621,224 | 4/1997 | Yamazaki et al. . |
| 5,624,851 | 4/1997 | Takayama et al. . |
| 5,637,515 | 6/1997 | Takemura . |
| 5,639,698 | 6/1997 | Yamazaki et al. . |
| 5,643,826 | 7/1997 | Ohtani et al. . |
| 5,646,424 | 7/1997 | Zhang et al. . |
| 5,654,203 | 8/1997 | Ohtani et al. . |
| 5,656,825 | 8/1997 | Kusumoto et al. . |
| 5,663,077 | 9/1997 | Adachi et al. . |
| 5,700,333 | 12/1997 | Yamazaki et al. . |

OTHER PUBLICATIONS

G. Liu et al., "Polycrystalline silicon thin film transistors on Corning 7059 glass substrates using short time, low–temperature processing," Appl. Phys. Lett. 62(20), May 17, 1993, pp. 2554–2556.

G. Liu et al., "Selective area crystallization of amorphous silicon films by low–temperature rapid thermal annealing," Appl. Phys. Lett. 55(7), Aug. 14, 1989, pp. 660–662.

*Primary Examiner*—Jey Tsai
*Assistant Examiner*—Michael S. Lebentritt
*Attorney, Agent, or Firm*—Sixbey, Friedman, Leedom & Ferguson, P.C.; Gerald J. Ferguson, Jr.; Jeffrey L. Costellia

[57] ABSTRACT

In a monolithic active matrix circuit formed on a substrate, the active regions of at least a part of the thin film transistors (TFTs) constituting the peripheral circuit for driving the matrix region are added with a metal element for promoting the crystallization of silicon at a concentration of $1 \times 10^{16}$ to $5 \times 10^{19}$ cm$^{-3}$, no metal element is added to the active region of the TFTs for the matrix region. The channel forming regions of at least a part of the TFTs constituting the peripheral circuit and the channel forming regions of the TFTs for the matrix region are formed by a silicon semiconductor thin film having a monodomain structure.

22 Claims, 13 Drawing Sheets

FIG. 5

| | SINGLE CRYSTALLINE SILICON TFT | MONODOMAIN TFT |
|---|---|---|
| GRAIN BOUNDARY | NO | NO |
| CONCENTRATION OF HYDROGEN ($cm^{-3}$) | detection limit | $1 \times 10^{15} - 1 \times 10^{20}$ |
| ESR ($cm^{-3}$) | detection limit | $1 \times 10^{15} - 1 \times 10^{17}$ |
| CRYSTALLINITY | YES | YES |
| MOBILITY ($Vs/cm^2$) | P-channel : 300-500<br>N-channel : 800-1200 | P-channel : 200-400<br>N-channel : 500-1000 |
| S VALUE | 0.01 - 0.1 | 0.03 - 0.3 |
| FORM | formed into single crystalline silicon wafer | semiconductor thin film formed on insulating substrate such as glass (strain point of 550 - 750 °C) is used. |
| PROCESS TEMPERATURE (°C) | 800 - 1100, typically 900 - 1000 | 450 - 700, typically 500 - 650 |

FIG. 6

|  | P - Si (poly-silicon) TFT | a - Si (amorphous silicon) TFT |
|---|---|---|
| GRAIN BOUNDARY | YES | NO |
| CONCENTRATION OF HYDROGEN (cm$^{-3}$) | $5 \times 10^{19}$ - $5 \times 10^{20}$ | $1 \times 10^{20}$ - $5 \times 10^{21}$ |
| ESR (cm$^{-3}$) | $1 \times 10^{17}$ - $1 \times 10^{18}$ | $1 \times 10^{18}$ - $1 \times 10^{19}$ |
| CRYSTALLINITY | YES | NO |
| MOBILITY (Vs / cm$^2$) | P - channel : 50 - 100<br>N - channel : 100 - 200 | P - channel : 0.01 - 0.5<br>N - channel : 0.5 - 2 |
| S VALUE | 0.1 - 0.5 | 0.3 - 0.7 |
| FORM | semiconductor thin film formed on insulating substrate such as glass is used. | semiconductor thin film formed on insulating substrate such as glass is used. |
| PROCESS TEMPERATURE (°C) | 300 - 600, typically 500 - 580 | 200 - 400, typically 300 - 350 | dd
SEMICONDUCTOR CIRCUIT FOR ELECTRO-OPTICAL DEVICE AND METHOD OF MANUFACTURING THE SAME

This is a Divisional application of Ser. No. 08/520,079, filed Aug. 28, 1995.

BACKGROUND OF THE INVENTION

The present invention relates to a semiconductor device, more particularly, to a thin film transistor, for an electro-optical device and a method of manufacturing the same. Even more particularly, the present invention relates to a semiconductor circuit having a plurality of thin film transistors (TFT) for an electro-optical device. A TFT according to the present invention is formed on either an insulating substrate made of glass or the like or a semiconductor substrate made of single crystal silicon or the like. The present invention especially relates to a semiconductor circuit having a matrix circuit operating at a low speed and peripheral circuits operating at a high speed for driving the same such as a monolithic active matrix circuit (used for a liquid crystal display device or the like).

Recently, techniques for forming transistors utilizing a semiconductor thin film (thin film transistors (TFT)) on a substrate made of glass or quartz have researched. Especially, techniques utilizing amorphous silicon as a semiconductor thin film has been put in practical use and are applied to active matrix type liquid crystal display devices or the like.

However, a TFT utilizing amorphous silicon has a problem in that its has low characteristics. For example, the characteristics of a TFT utilizing an amorphous silicon film is too low to provide high display performance of an active matrix type liquid crystal display device.

A technique for forming a TFT using a crystalline silicon film obtained by crystallizing an amorphous silicon film is known wherein an amorphous silicon film is transformed into a crystalline silicon film by performing a heating process or laser irradiation after forming an amorphous silicon film. In general, a crystalline silicon film has a polycrystalline structure or a microcrystalline structure. A TFT formed by a crystalline silicon film provides characteristics much higher than those of a TFT formed by an amorphous silicon film. In mobility which is one of parameters for evaluating the characteristics of TFTs, a TFT utilizing an amorphous silicon film has mobility of 1-2 cm$^2$/Vs or less while the mobility of a TFT utilizing a crystalline silicon film can be about 100 cm$^2$/Vs or more.

However, a crystalline silicon film has many problems originating from grain boundaries because it has a polycrystalline structure. For example, a severe limitation is put on the withstand voltage of a TFT by the presence of carriers which move through grain boundaries. Further, the characteristics of a TFT can be changed or deteriorated, when it is operated at a high speed. In addition, the presence of carriers moving through grain boundaries increases leakage current from a TFT when it is turned off.

In order to form an active matrix type liquid crystal display device with a high level of integration, it is desirable to form not only the pixel region but also the peripheral circuits on a single glass substrate. In this case, since several hundred thousands of pixel transistors provided in the form of a matrix are driven, the TFTs provided in the peripheral circuits must be capable of handling a high current.

In order to provide a TFT capable of handling a high current, a structure having a large channel width must be employed. However, a TFT utilizing a polycrystalline silicon film or microcrystalline silicon film is not practical even with a wide channel width because of the problem with the withstand voltage. Further, it is impractical from other points of views such as significant fluctuations in thresholds.

Also, researches are made on insulated gate type semiconductor devices having an active layer (also referred to as active region) in the form of a thin film on an insulating substrate. Especially, researches are active on insulated gate type transistors in the form of a thin film, i.e., the so-called thin film transistor (TFTs). They are formed on a transparent insulating substrate and are used for pixel control and for driving circuits in display devices such as liquid crystal display devices having a matrix structure.

Semiconductor thin films forming TFTs include amorphous silicon semiconductors and crystalline silicon obtained by crystallizing amorphous silicon semiconductors by heating and laser irradiation. TFTs utilizing such amorphous silicon thin film and crystalline silicon thin films are called amorphous silicon TFTs and crystalline silicon TFTs, respectively. Since the electrical field mobility of an amorphous semiconductor is generally low, such a semiconductor can not be used for TFTs which must be operated at a high speed. In order to manufacture circuits having higher performance, research and development are active on crystalline silicon TFTs.

Since the electrical field mobility of a crystalline semiconductor is higher than that of an amorphous semiconductor, a crystalline semiconductor can be operated at a higher speed. A CMOS circuit can be formed from crystalline silicon because not only an NMOS TFT but also a PMOS TFT can be obtained from crystalline silicon. In the field of active matrix type liquid crystal display device, a device having the so-called monolithic structure is known in which not only the active matrix circuit portion but also peripheral circuits (drivers and etc.) are formed using CMOS crystalline TFTs.

FIG. 10 shows a monolithic type active matrix circuit used in a liquid crystal display device. A column decoder 1 and a line decoder 2 are formed on a substrate 7 as a peripheral driver circuit. A multiplicity of pixel circuits 4 including transistors and capacitors are formed in a matrix region 5 wherein a multiplicity of pixels are provided in the form of a matrix, and the matrix region and the peripheral circuit are connected to each other by wirings 5 and 6. The TFTs used in the peripheral circuit must be able to operate at a high speed and the TFTs used in the pixel circuit must have a low leakage current. The device having such characteristics contradictory to each other must be formed on the same substrate simultaneously.

However, TFTs manufactured by the same process have similar characteristics. Although crystalline silicon can be obtained by crystallization using a laser (laser annealing), if crystalline silicon obtained by laser crystallization is used for both of the TFTs for the matrix region and the peripheral driving circuit region, the TFTs will have similar characteristics. As a result, it will be difficult to achieve both of the low leakage current characteristic required for the pixel circuit and the high mobility characteristic required for the peripheral driving circuits.

SUMMARY OF THE INVENTION

The present invention is to provide a TFT which is not adversely affected by the grain boundaries, has a high withstand voltage, is capable of handling a high current, and has characteristics which are subjected to less deterioration and fluctuation and similar to those utilizing a single crystal semiconductor.

According to one aspect of the invention disclosed in this specification, there is provided a semiconductor device utilizing a semiconductor thin film formed on a substrate having an insulating surface wherein the semiconductor thin film is crystalline and includes hydrogen or halogen elements, and wherein no grain boundary exists in the semiconductor thin film which forms the active layer of the semiconductor device.

According to another aspect of the present invention, there is provided a semiconductor device utilizing a semiconductor thin film formed on a substrate having an insulating surface wherein the semiconductor thin film is crystalline, and wherein the semiconductor thin film which forms the active layer of the semiconductor device has no grain boundary and includes point defects at $1 \times 10^{16}$ cm$^{-3}$ or more to be neutralized and includes hydrogen or halogen elements to neutralize the point defects at a concentration of $1 \times 10^{15}$ to $1 \times 10^{20}$ cm$^{-3}$.

In general, point defects present in a single crystal silicon wafer fabricated from melted silicon is equal to or less than the limit of measurement ($1 \times 10^{16}$ cm$^{-3}$). In this sense, a thin film like region which has no grain boundary (monodomain region) disclosed in this specification is different from a conventional single crystal semiconductor wafer. The thin film silicon semiconductor disclosed in this specification includes carbon and nitrogen atoms at a concentration of $1 \times 10^{16}$ to $5 \times 10^{18}$ cm$^{-3}$ and oxygen atoms at a concentration of $1 \times 10^{17}$ to $5 \times 10^{19}$ cm$^{-3}$.

The thickness of the semiconductor thin film disclosed in this specification is 200 to 2000 Å. This is because this semiconductor is obtained from a thin amorphous silicon film formed using plasma CVD or low pressure thermal CVD as the starting film. The presence of point defects to be neutralized (dangling bonds) is also a result of the fact that the starting film is a thin film silicon semiconductor formed using CVD.

Metal elements that promotes crystallization of silicon is advantageously used in the process of fabricating the thin film silicon semiconductor disclosed in this specification. One or plural kinds of elements selected from among Fe, Co, Ni, Ru, Rh, Pd, Os, Ir, Pt, Cu, Zn, Ag, and Au can be used as such metal elements. Such elements are invasive to silicon and diffuse in a silicon film by a heating process or laser irradiation. Ni (nickel) is the most effective element among the above elements.

Such metal elements can be introduced by forming the metal elements themselves or a layer including the metal elements in contact with the upper or lower surface of an amorphous silicon film and then irradiating them with laser light while heating them. Alternatively, laser irradiation may be performed after the heating process.

The concentration of the above metal elements for promoting crystallization which are finally left in the film must be $1 \times 10^{16}$ to $5 \times 10^{19}$ cm$^{-3}$. The reason is that if the concentration of the metal elements is higher than this concentration range, the function of the resultant device is adversely affected by deteriorating a semiconductor characteristic and that if the concentration of the metal elements is lower than this concentration range, the promotion of crystallization is not achieved.

According the another aspect of the present invention, there is provided a semiconductor device whose active layer is formed by a semiconductor thin film formed on a substrate having an insulating surface wherein the semiconductor thin film is crystalline, the active layer has a source region, drain region, and a channel forming region, and no grain boundary exists in the channel forming region.

The above configuration wherein the channel forming region is formed as a monodomain region and no grain boundary exists in at least the channel forming region to provide a TFT having high characteristics. This is because such a configuration eliminates carrier scattering and the fluctuation and deterioration of characteristics due to the presence of grain boundaries. It is preferable to form the whole active layer including the source and drain regions as a monodomain region.

According to another aspect of the invention, there is provided a semiconductor device whose active layer is formed by a semiconductor thin film formed on a substrate having an insulating surface wherein the semiconductor thin film is crystalline, the active layer has a source region, drain region, and a channel forming region, no grain boundary exists in the channel forming region, and there are point defects at $1 \times 10^{16}$ cm$^{-3}$ or more in the channel forming region.

According to another aspect of the invention, there is provided a semiconductor device forming method including the steps of, forming an amorphous silicon film on a substrate having an insulating surface and forming a crystalline thin film silicon semiconductor having a spin density of $1 \times 10^{15}$ to $1 \times 10^{19}$ cm$^{-3}$ by irradiating the film with laser light or intense light with 450° to 750° C. A monodomain region as disclosed in this specification can be effectively formed by performing laser irradiation while heating. In this case, it is important that the sample (the surface on which the monodomain region is formed) is irradiated by laser light with 450° to 750° C., preferably, 500° to 600° C. Other types of intense light such as infrared light may be used instead of laser light.

When metal elements for promoting the crystallization of silicon is introduced as described above, it is effective to perform a heating process to cause crystallization or the generation of crystalline nuclei before they are irradiated by laser light. Further, a heating process after laser irradiation is effective for reducing defects in a film. It is also effective to neutralize defects in a film by performing a hydrogenation process after crystallization process. Such hydrogenation process can be achieved by a heating process or plasma process in hydrogen or an atmosphere including hydrogen.

A region having no grain boundary can be regarded as one domain (monodomain). A TFT formed utilizing such a region which can be regarded as a single crystal region is referred to as a monodomain TFT. For example, such a single crystal region can be formed in a silicon thin film using the method as follows. An amorphous silicon film is first formed on a glass substrate or quartz substrate, and then a film including nickel is formed on the surface of the amorphous silicon film. This film including nickel may be provided by forming a very thin nickel film using sputtering or the like. Alternatively, a method may be employed wherein a solution including nickel is added to the surface of an amorphous silicon film so that nickel elements are provided in contact with the surface of the amorphous silicon film.

After nickel elements are introduced in the amorphous silicon film, a heating process is performed to crystallize the amorphous silicon film. The action of the nickel elements allows this heating process to be performed at 750° C. or less. When a glass substrate is used, the preferable temperature for this heating process is 600° C. or less. If the efficiency of the crystallization process is considered, the temperature is preferably 500° C. or more, preferably, 550° C. or more. When a quartz substrate is used, this heating process can be performed at 450° C. or more to provide a crystalline silicon film in a short period of time. A crystalline silicon film obtained in this process is in a polycrystalline or microcrystalline state and includes grain boundaries.

Then, laser irradiation is performed on the sample which has been heated to 450° C. or more, to locally promote the crystallinity of the regions irradiated by laser light. This process forms regions which can be regarded as single crystal regions. It is important that the sample or the surface to be irradiated by laser light is heated to 450 ° C. or more. The temperature is preferably 450° to 750° C., and 450° to 600° C. if a glass substrate is used.

There is an alternative method wherein after the formation of an amorphous silicon film followed by the introduction of metal elements for promoting crystallization, laser irradiation is performed to form regions which can be regarded as single crystal regions. In this case, it is important again that the sample is heated to 450° to 750° C., and 450° to 600° C. (750° C. if the substrate is resistant enough) if a glass substrate is used.

A heating process following the laser irradiation at 450° to 750° C. (750° C. if the substrate is resistant enough) is effective in reducing defects in the film. Heating process, laser irradiation, second heating process and the like are be most effective if they are performed repeatedly in succession.

It is very effective to perform a heating process in a hydrogen atmosphere after the laser irradiation, to neutralize defects (dangling bonds) in the film.

The regions which can be regarded as single crystal regions are obtained from a silicon film formed using plasma CVD or low pressure thermal CVD as the starting film and include carbon and nitrogen at a concentration of $1 \times 10^{16}$ to $5 \times 10^{18}$ cm$^{-3}$ and oxygen at a concentration of $1 \times 10^{17}$ to $5 \times 10^{19}$ cm$^{-3}$. Further, since there are lattice defects by nature, they include hydrogen at a concentration of $1 \times 10^{17}$ to $5 \times 10^{20}$ cm$^{-3}$ to neutralize the dangling bonds of silicon. Specifically, a region that can be regarded as a single crystal region is characterized in that it has point defects but has neither line defect nor plane defect. The concentration of the elements contained is defined as the minimum value measured using SIMS (secondary ion mass spectrometry).

FIG. 5 and FIG. 6 show tables for comparing various characteristics of a conventional single crystal MOS transistor, a polycrystalline silicon (P-Si) TFT, an amorphous silicon (a-Si) TFT, and a monodomain TFT. By using a region of a thin film silicon semiconductor that can be regarded as a single crystal region as an active layer, a TFT having a high withstand voltage, less fluctuation and deterioration of characteristics can be obtained.

In addition, researches by the inventor have revealed that, as described above, addition of a very small amount of metallic material to a substantially amorphous silicon film promotes crystallization, decreases the temperature at which crystallization occurs, and shorten the time required for crystallization. One or plural kinds of elements selected from among Fe, Co, Ni, Ru, Rh, Pd, Os, Ir, Pt, Cu, Ag, and Au or compounds of these elements (e.g., suicides) can be used as catalyst.

Specifically, a film, particles, a cluster, or the like including such metal elements is in close contact with amorphous silicon. Alternatively, these catalyst elements are introduced into an amorphous silicon film using methods such as ion implantation. Thereafter, crystallization can be achieved by a heating process at an appropriate temperature, e.g., 550° C. or less for about four hours.

In general, the higher the annealing temperature is, the shorter the time required for crystallization is. Further, the higher the concentration of the metal elements is, the lower the crystallization temperature is and the shorter the time required for crystallization is. Researches by the inventor have revealed that the concentration of at least one element must be $1 \times 10^{16}$ cm$^{-3}$ in order that crystallization proceeds in thermal equilibrium. It has been also revealed that if the concentration is $5 \times 10^{19}$ cm$^{-3}$ or more, the properties of the semiconductor material is deteriorated. Specifically, it has been revealed that the concentration of the metal elements for promoting the crystallization of silicon is preferably $1 \times 10^{16}$ to $5 \times 10^{19}$ cm$^{-3}$. It has been revealed that the use of nickel from among the above elements is most effective. The concentration of impurities is defined as the minimum value measured using SIMS (secondary ion mass spectrometry).

It has been revealed that in the method of providing a crystalline silicon film by crystallizing an amorphous silicon film using laser irradiation, a domain of a greater grain size (monodomain region) can be obtained by heating the sample at 450° C. or more during laser irradiation. The monodomain region has a crystal structure which can be regarded as a single crystal.

There is no grain boundary in the monodomain region. Unlike a single crystal silicon wafer, it has point defects to be neutralized therein. It includes hydrogen or halogen elements for neutralizing the point defects at a concentration of $1 \times 10^{15}$ to $1 \times 10^{20}$ cm$^{-3}$.

If metal elements such as nickel is introduced into the starting film for forming the monodomain region, a monodomain region having defects in a lower density can be obtained. A TFT fabricated using such a monodomain region formed by introducing metal elements has a higher level of mobility and can pass a higher ON current.

The invention disclosed in this specification is characterized in that TFTs having different characteristics are selectively fabricated on the same substrate utilizing the action of metal elements that promote crystallization of silicon as described above. Specifically, after an amorphous silicon film is formed, a material including catalyst elements is selectively in contact with or introduced into a part of the film. After that, the entire surface of the film is irradiated by laser light or intense light equivalent thereto with the sample heated to 450° to 750° C,. preferably 450° to 600° C. Alternatively, laser light or intense light equivalent thereto are scanned across the entire surface to form monodomain regions having different electrical characteristics on the same substrate. Using the monodomain regions formed selectively, TFTs having desired characteristics are formed in desired regions.

In addition, it is possible to form monodomain regions having different electrical characteristics selectively by introducing metal elements in different concentrations, to thereby form TFTs having different characteristics on the same substrate.

It is very important that the sample is heated to 450° to 750° C. or 450° to 600° C. if the heat-resisting properties of the glass substrate is considered during irradiation by laser light or intense light.

It is effective to perform a heating process before or after the irradiation by laser light or intense light for forming the monodomain regions. A heating process before the laser irradiation allows the formation of nuclei for crystal growth during the laser irradiation. A heating process after the laser irradiation allows defects in the film to be reduced. If a heating process is performed both before and after the laser irradiation, the above two effects can be obtained. That is, both of the formation of crystal nuclei and the reduction of defects in the film can be achieved.

According to one aspect of the invention disclosed in this specification, there is provided a monolithic active matrix circuit formed on a substrate wherein the active regions of at least a part of the TFTs constituting the peripheral circuit are added with a metal element for promoting the crystallization of silicon at a concentration of $1\times10^{16}$ to $5\times10^{19}$ $cm^{-3}$, no metal element is added to the active regions of the TFTs for the matrix region, and the channel forming regions of at least a part of the TFTs constituting the peripheral circuit and the channel forming regions of the TFTs for the matrix region are formed by a silicon semiconductor thin film having a monodomain structure.

In the above configuration, the "monolithic active matrix circuit formed on a substrate" corresponds to the configuration shown in FIG. 10; the "at least a part of the TFTs constituting the peripheral circuit" corresponds to the TFTs constituting the peripheral circuits 1 and 2 in FIG. 10; and the "active regions of TFTs" correspond to the regions 142 and 143 of the TFT shown in FIG. 8C having a source-region, a drain region, and a channel forming region. The active regions may include an offset gate region and a lightly doped region.

The "matrix region" corresponds to the region 3 in FIG. 10. A plurality of pixels (normally several millions of pixels) are provided in the form of a matrix in this matrix region. The "silicon semiconductor thin film whose channel forming region has a monodomain structure" corresponds to the examples shown in FIGS. 8A–8E. In FIGS. 8A–8E, active regions 141 to 143 of respective TFTs are formed in monodomain regions 121 to 123.

It is not always true that all the TFTs provided in the peripheral driving circuits must have high mobility, high speed operation, and the capability of passing a high ON current. When the inverter circuit as shown in FIG. 13A or FIG. 13B is used as a peripheral circuit, since N-channel type TFTs 601 and 603 function as load resistors, there is no need for a configuration which provides high mobility, high speed operation, and the capability of passing a high ON current.

FIG. 13A shows a basic configuration of an inverter wherein a depression type TFT is used as the N-type TFT 601 serving as a load and an enhancement type TFT is used as the N-type TFT 602. FIG. 13B shows a basic configuration of an inverter wherein an enhancement type TFT is used as the Ntype TFT 603 serving as a load and an enhancement type TFT is used as the N-type TFT 602. In this case, it is not essential that the active regions of the TFTs 601 and 603 are formed from metal elements for promoting crystallization. Further, it is not essential that the active regions of the TFTs 601 and 603 have a monodomain structure. Therefore, the "at least a part of the TFTs constituting the peripheral circuits" corresponds to the TFTs 602 and 604 in FIG. 13A and FIG. 13B.

According to another configuration of the present invention, there is provided a monolithic active matrix circuit formed on a substrate wherein the active regions of at least a part of the TFTs constituting the peripheral circuits are added with metal elements for promoting the crystallization of silicon at a concentration of $1\times10^{16}$ to $5\times10^{19}$ $cm^{-3}$; no metal element is added to the active regions of the TFTs for the matrix region; and the active regions of at least a part of the TFTs constituting the peripheral circuits and the active regions of the TFTs for the matrix region are constituted by a silicon semiconductor thin film having a monodomain structure.

According to another configuration of the present invention, there is provided a monolithic active matrix circuit formed on a substrate wherein the active regions of at least a part of the TFTs constituting the peripheral circuits are added with metal elements for promoting the crystallization of silicon at a concentration of $1\times10^{16}$ to $5\times10^{19}$ $cm^{-3}$; the concentration of the metal elements in the active regions of at least a part of the TFTs constituting the peripheral driving circuits is different from the concentration of the metal elements in the active regions of the TFTs in the matrix region; and the active regions have a monodomain structure. This configuration is characterized in that the electrical characteristics of the resultant monodomain regions are controlled by changing the amount of the metal elements added (introduced) for promoting crystallization.

As described above, the characteristics required for the TFTs in the peripheral driving circuit region are different from those required for the TFTs in the matrix region. Specifically, in the peripheral driving circuit region, a TFT must provide high mobility and must be able to pass a high ON current and to operate at a high speed even at the sacrifice of other characteristics. On the other hand, in the matrix region, a TFT must have a low OFF current even at the sacrifice of other characteristics. In general, in a configuration that allows a high ON current to pass therethrough, the OFF current is also high.

According to the above configuration, TFTs capable of passing a higher ON current therethrough are provided by introducing a larger amount of metal elements for promoting crystallization into the semiconductor thin film constituting the TFTs provided in the peripheral driving circuit region, for improved crystallinity.

On the other hand, a smaller amount of metal elements for promoting crystallization is introduced into the matrix region to provide TFTs which are low in the crystallinity of the active regions (the density of defects is relatively high) but for which the OFF current can be made smaller.

According to another configuration of the present invention, there is provided a monolithic active matrix circuit formed on a substrate wherein the active regions of at least a part of the TFTs constituting the peripheral circuits are added with metal elements for promoting the crystallization of silicon at a concentration of $1\times10^{16}$ to $5\times10^{19}$ $cm^{-3}$; the concentration of the metal elements in the active regions of at least a part of the TFTs constituting the peripheral driving circuits is higher than that of the metal elements in the active regions of the TFTs in the matrix region; and the active regions have a monodomain structure.

According to another configuration of the present invention, there is provided a monolithic active matrix circuit formed on a substrate wherein the active regions of at least a part of the TFTs constituting the peripheral circuits are added with metal elements for promoting the crystallization of silicon at a concentration of $1\times10^{16}$ to $5\times10^{19}$ $cm^{-3}$; the concentration of the metal elements in the active regions of at least a part of the TFTs constituting the peripheral driving circuits is different from the concentration of the metal elements in the active regions of the TFTs in the matrix region; and the active regions have a monodomain structure. This configuration is characterized in that the electrical characteristics of the resultant monodomain regions are controlled by changing the amount of the metal elements added (introduced) for promoting crystallization.

According to another configuration of the present invention, there is provided a monolithic active matrix circuit formed on a substrate wherein the active regions of at least a part of the TFTs constituting the peripheral circuits are added with metal elements for promoting the crystallization of silicon at a concentration of $1\times10^{16}$ to $5\times10^{19}$ $cm^{-3}$; no metal element is added to the active regions of the TFTs for the matrix region; and the active regions of at least a part of the TFTs constituting the peripheral circuits have a monodomain structure; and the TFTs in the matrix region are crystalline.

The above configuration is characterized in that the TFTs in the matrix region are formed by a crystalline silicon semiconductor thin film obtained using laser irradiation and a heating process. The TFTs in the matrix region can be constituted by TFTs utilizing a conventional crystalline silicon semiconductor film because they are not required to have high mobility and to operate at a high speed.

Circuits having transistors which has contradictory characteristics, i.e., a low OFF current and a high operation speed can be simultaneously formed on the same substrate by using regions having less metal elements that promotes crystallization of silicon for TFTs having a low OFF current for the pixel circuits of an active matrix circuit or the like and by using regions having more metal elements for high speed TFTs for peripheral driving circuits or the like.

BRIEF DESCRIPTION OF THE DPAWINGS

FIG. 5 is a table for comparison between a single crystal TFT and a monodomain TFT;

FIG. 6 is a table for comparison between a polycrystalline TFT and an amorphous TFT;

DETAILED DESCRIPTION OF THE PREFERRED EMBODIMENTS

First Embodiment

In the embodiment, a glass substrate having a glass strain point temperature of 350° to 700° C. A Corning 7059 glass substrate is used, and a thin film transistor (TFT) is fabricated at a temperature equal to or lower than the strain point temperature of this glass substrate. The strain point of a Corning 7059 glass substrate is 593° C., and a heating process at a temperature higher than this temperature is not preferable because it can cause shrinkage and transformation of the glass substrate. Especially, when a glass substrate having a large surface area is used to form a large size liquid crystal display device, the effect of such shrinkage and transformation of the glass substrate will be significant. In the embodiment, the maximum temperature during the heating process is limited to 600° C. or less, preferably 550° C. or less to significantly reduce the influence of the heat to the substrate.

FIGS. 1A to 1D show manufacturing steps of the TFT according to the present embodiment. A silicon oxide film 102 having a thickness of 3000 Å is formed as a base film on a Corning 7059 glass substrate 101 by using sputtering, and then an amorphous silicon fiLm is formed by using plasma CVD or low pressure thermal CVD to a thickness of 500 Å.

Figure 1A:
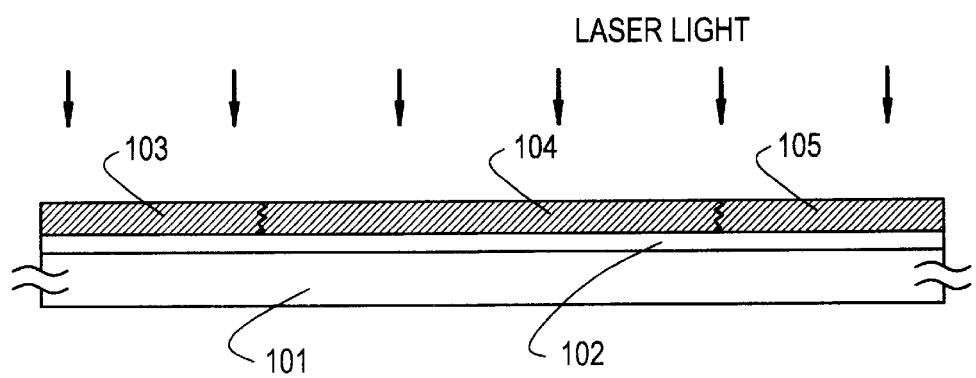
FIGS. 1A to 1D show manufacturing steps of a thin film transistor (TFT) according to an embodiment.
Figure 2A:
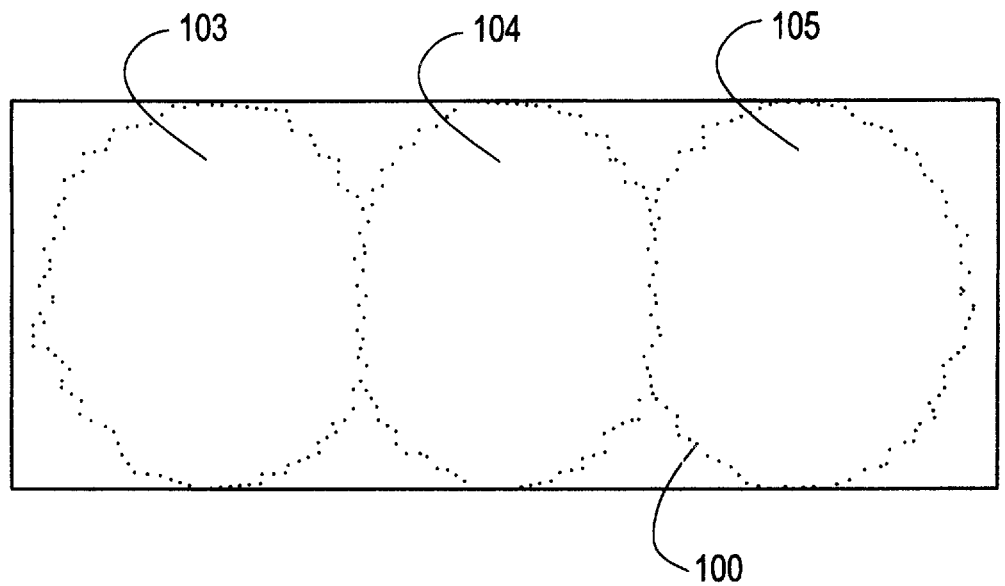
FIG. 2A and FIG. 2B show the shape of a monodomain and an active layer.
Figure 2B:
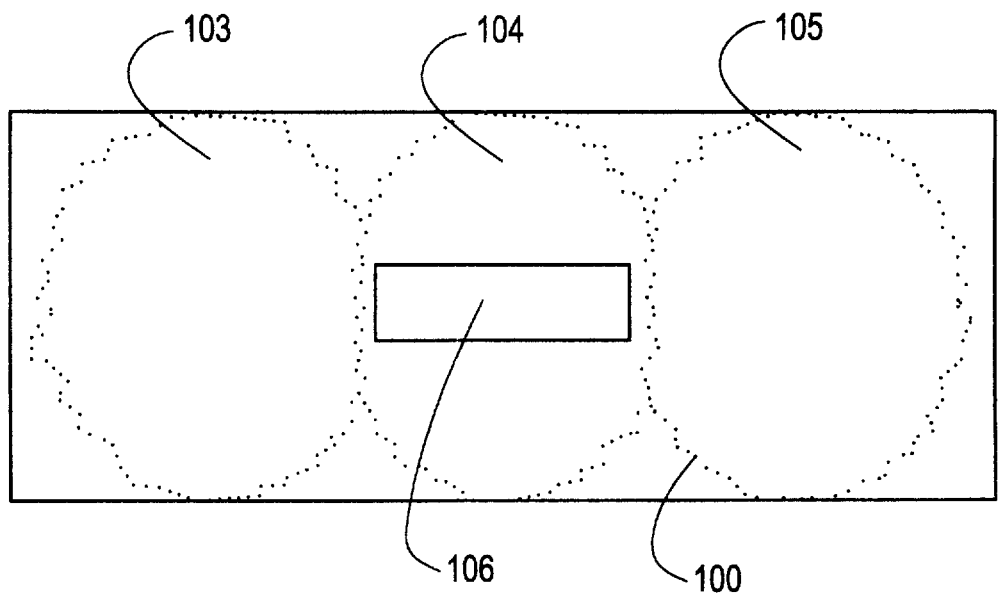

After the formation of the amorphous silicon film, the sample is irradiated by laser light (KrF excimer laser) with the sample heated to 450° to 750° C. (550° C., in this case) to form monodomain regions 103, 104, and 105 which can be regarded as single crystal regions as shown in FIG. 1A. FIG. 2A shows the state shown in FIG. 1A as viewed from the upper side. The monodomain regions 103 to 105 are adjacent to each other at a grain boundary 100. Although FIG. 2A shows only three monodomain regions, a greater number of monodomains are actually formed. A monodomain is not limited to a circular shape but can be in any shape. A monodomain (which can be regarded as a single crystal) region having a gain size of 50 $\mu$m or more can be formed by heating the sample to a temperature as high as 550° C. when it is irradiated by laser light as in the embodiment.

Figure 1B:
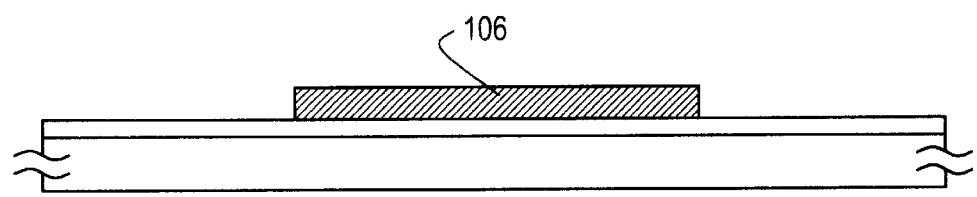

It is effective to introduce metal elements that promote crystallization into the amorphous silicon film during the above process. As a result, regions which can be regarded as single crystal regions can be formed in greater area. When the regions 103 to 105 which can be regarded as single crystal regions are obtained, the active layer of a TFT is formed by patterning using these regions. Most preferably, an active layer is formed as a whole in a region which can be regarded as a single crystal. In this case, an active layer 106 is formed in the region 104. Thus, a region 100 of FIG. 1B is formed as an active layer.

Figure 7:
FIG. 7 shows a picture of the crystal structure of a silicon semiconductor thin film.

There is substantially no grain boundary in the monodomain 104. Therefore, there is provided a TFT having characteristics equivalent to those obtained using a single crystal. FIG. 7 shows a picture of the crystal structure of a silicon semiconductor thin film obtained by a KrF excimer laser irradiation while heating it to 550° C. A monodomain TFT can be provided by forming the active layer of the TFT using a monodomain of FIG. 7.

After the active layer 106 is formed, a silicon oxide film 112 having a thickness of 1000 Å is formed as a gate insulating film by using plasma CVD, and a film mainly composed of aluminum containing 0.2% scandium is formed to a thickness of 6000 Å. Then, this film mainly composed of aluminum is patterned to form a gate electrode 113.

An oxide layer 114 is formed by anodization in an ethylene glycol solution containing 10% tartaric acid using the gate electrode 113 as an anode. The thickness of the oxide layer 114 is on the order of 2000 Å. The presence of the oxide layer 114 allows the formation of an offset gate region during an impurity ion implantation performed later.

Figure 1C:
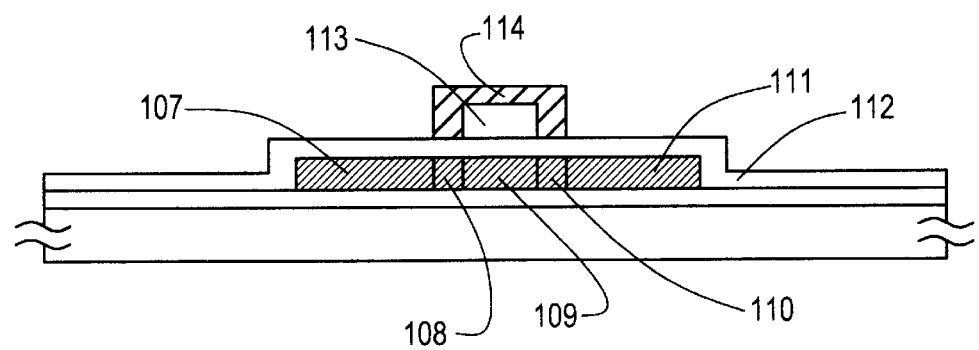

Impurity ions are implanted in the active layer. Phosphorus (P) ions are implanted if an N-channel type TFT is formed, and boron (B) ions are implanted if a P-channel type TFT is formed. During this process, the impurity ions are implanted into regions 107 and 111 with the gate electrode 113 and the oxide layer 114 surrounding it as masks. The regions 107 and 111 into which the impurity ions are implanted are formed as a source region and a drain region, respectively. At the same time, offset gate regions 108 and 110 are formed, with the oxide layer 114 around the gate electrode 113 as a mask. A channel forming region 109 is also formed on a self alignment manner (FIG. 1C).

After the impurity ion implantation, laser irradiation is performed to anneal the active layer which has been damaged by the impurity ion implantation and to activate the impurities implanted. This process may be performed using intense light such as infrared light.

Figure 1D:
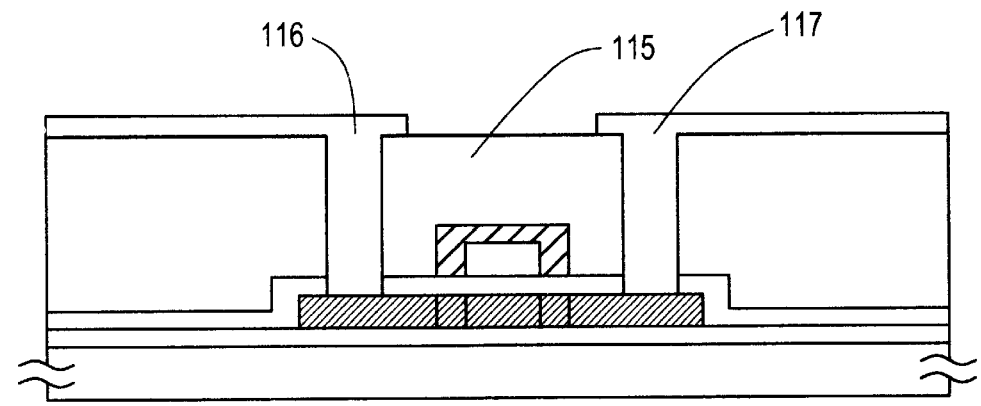

A silicon oxide film 115 having a thickness of 7000 Å is formed as a interlayer insulating film by using plasma CVD and then a hole forming process is performed to form a source electrode 116 and a drain electrode 117. Further, a heating process is performed in a hydrogen atmosphere at 350° C. to complete a TFT (FIG. 1D).

Since the active layer of the TFT of the embodiment is constituted by a region having a structure which can be regarded as a single crystal (a monodomain region), it is possible to avoid the problem of a low withstand voltage and a high leakage current originating from grain boundaries. Although one TFT is formed in the embodiment, it is possible to form a plurality of TFTs using a plurality of monodomain regions.

Second Embodiment

In the embodiment, metal elements for promoting crystallization are introduced into an amorphous silicon film to form a crystalline region that can be regarded as a single crystal, and a TFT is configured using this crystalline region. The manufacturing steps of the embodiment are the same as those in the first embodiment except the process of introducing the metal elements for promoting crystallization. In the embodiment, after the amorphous silicon film is formed, the surface of the amorphous silicon film is subjected to ultraviolet (UV) oxidation to form an extremely thin oxide film (not shown). This oxide film is provided to improve wettability during a solution adding process performed later. The UV oxidation is a process to form an extremely thin oxide film on a surface by irradiating the surface with ultraviolet light in an oxidizing atmosphere.

The surface of the amorphous silicon film on which the extremely thin oxide film has been formed is coated with a nickel acetate solution by spin coating to form a coating film containing nickel thereon. The presence of this coating film realizes a state wherein nickel elements are provided adjacent to the amorphous silicon film through the extremely thin oxide film.

In such a state, a heating process is performed for four hours at 550° C. to transform the amorphous silicon film into a crystalline silicon film. Since nickel which is a metal element that promotes crystallization is introduced, a crystalline silicon film can be obtained through a heating process at 550° C. for about four hours.

After the silicon film is transformed into a crystalline silicon film by the heating process, the film is irradiated by laser light to form the monodomain regions 103 and 104 as shown in FIG. 1. Since nickel which is a metal element that promotes crystallization is introduced, larger monodomain regions can be obtained. After the monodomain regions are obtained, a TFT is formed in the same manner as in the first embodiment.

Third Embodiment

The present embodiment is an example of the formation of a channel forming region of a TFT utilizing one monodomain region. FIGS. 3A to 3D show the manufacturing steps of the TFT according to the embodiment.

A silicon oxide film 102 having a thickness of 3000 Å is formed as a base film on a glass substrate 101 using sputtering, and then an amorphous silicon film is formed by using plasma CVD or low pressure thermal CVD to a thickness of 500 Å. The sample is then irradiated by laser light (KrF excimer laser) with the sample heated to 550° C. to form a plurality of monodomain regions 103 to 105 (FIG. 3A).

Figure 3A:
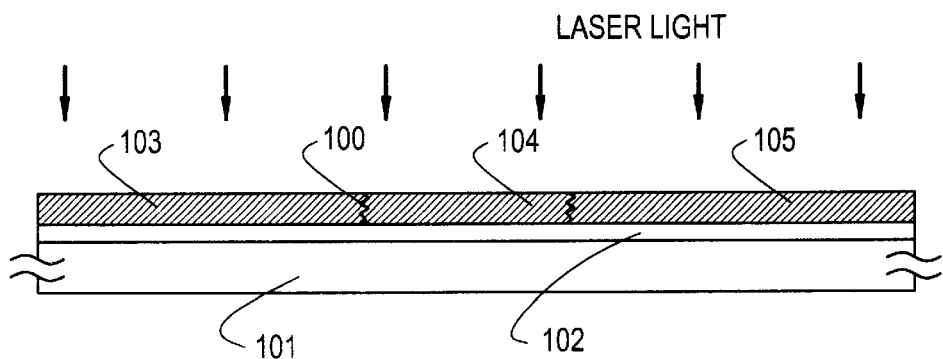
FIGS. 3A to 3D show a configuration of a TFT according to an embodiment.
Figure 3B:
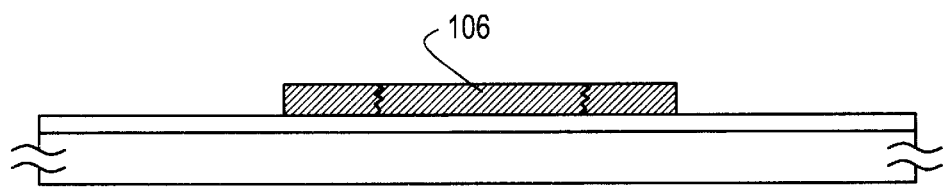
Figure 3C:
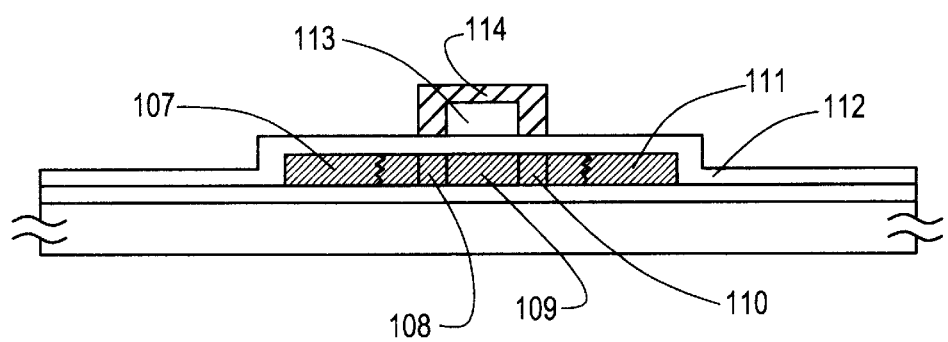
Figure 4A:
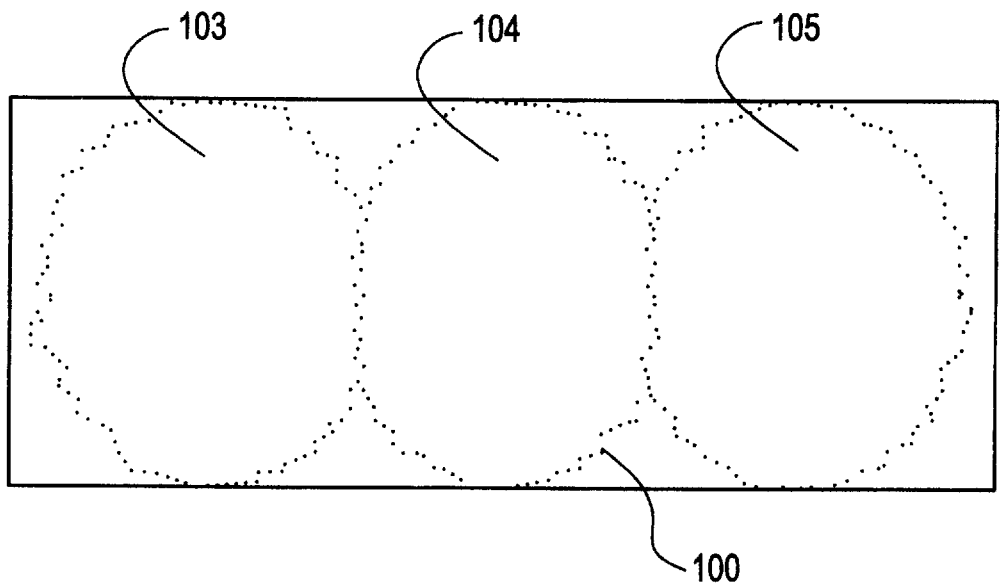
FIG. 4A and FIG. 4B show the shape of a monodomain and an active layer.
Figure 4B:
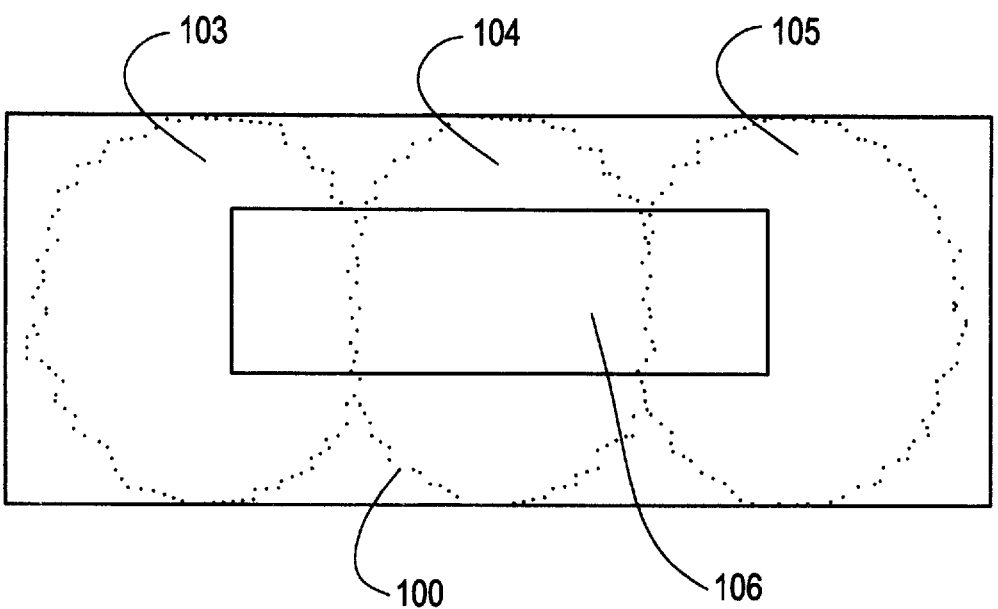

FIG. 4A shows the state shown in FIG. 3A as viewed from the upper side. The monodomain regions 103 to 105 are adjacent to each other at a grain boundary 100. The interior of the grain boundary is a region which can be regarded as a single crystal, i.e., a monodomain region. Then, an active layer 106 is formed so that a channel forming region (the region 109 in FIG. 3C) is included in the monodomain region 104 (FIG. 3B).

After the active layer 106 is formed, a silicon oxide film 112 having a thickness of 1000 Å is formed as a gate insulating film using plasma CVD, and a film mainly composed of aluminum containing 0.2% scandium is formed to a thickness of 6000 Å. Then, this film mainly composed of aluminum is patterned to form a gate electrode 113.

An oxide layer 114 having a thickness of about 2000 Å is formed by anodization in an ethylene glycol solution containing 10% tartaric acid using the gate electrode 113 as an anode. The presence of the oxide layer 114 allows the formation of an offset gate region during an impurity ion implantation performed later.

Impurity ions are implanted in the active layer. Phosphorus ions are implanted if an N-channel type TFT is formed, and boron ions are implanted if a P-channel type TFT is formed. During this process, the impurity ions are implanted into regions 107 and 111 with the gate electrode 113 and the oxide layer 114 surrounding it as masks. The regions 107 and 111 into which the impurity ions are implanted are formed as a source region and a drain region, respectively. At the same time, offset gate regions 108 and 110 are formed, with the oxide layer 114 around the gate electrode 113 as a mask. A channel forming region 109 is also formed on a self alignment basis (FIG. 3C).

After the impurity ion implantation, laser irradiation is performed to anneal the active layer which has been damaged by the impurity ion implantation and to activate the impurities implanted. This process may be performed using intense light such as infrared light.

Figure 3D:
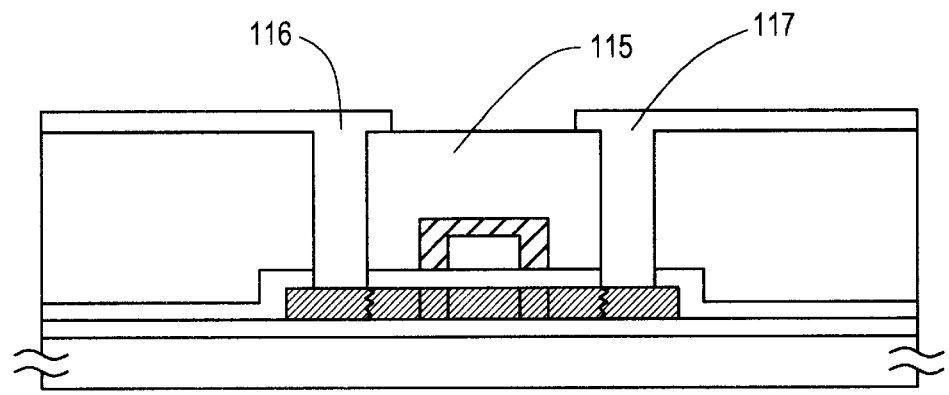

A silicon oxide film 115 having a thickness of 7000 Å is formed as a layer insulating film using plasma CVD and then a hole forming process is performed to form a source electrode 116 and a drain electrode 117. Further, a heating process is performed in a hydrogen atmosphere at 350° C. to complete a TFT (FIG. 3D).

The channel forming region of the TFT of the embodiment is constituted by a region having a structure which can be regarded as a single crystal (a monodomain region). Thus, there is nothing to hinder the movement of carriers, and this makes it to obtain preferable characteristics.

According to the configuration of the embodiment, the size of the channel forming region is sufficient as the minimum requirement for the monodomain region. This provides improved flexibility in manufacturing the TFT.

Although the embodiment shows an example wherein one TFT is formed, it is possible to form a plurality of TFTs using a plurality of monodomain regions. The invention disclosed in this specification makes it possible to provide a TFT which is free from the influence of a grain boundary. It is also possible to provide a TFT which has a high withstand voltage and less fluctuation in its characteristics and which is capable of handling high current. Further, it is possible to provide a TFT which is not adversely affected by a grain boundary in operation and which is characterized by a low OFF current.

Fourth Embodiment

In the embodiment, TFTs having different characteristics are manufactured by selectively introducing metal elements that promote crystallization of silicon into an amorphous silicon film. According to the embodiment, TFTs provided in the pixel region of an active matrix type liquid crystal display device is formed without introducing such metal elements and TFTs constituting peripheral circuits are formed by introducing the metal elements.

Figure 10:
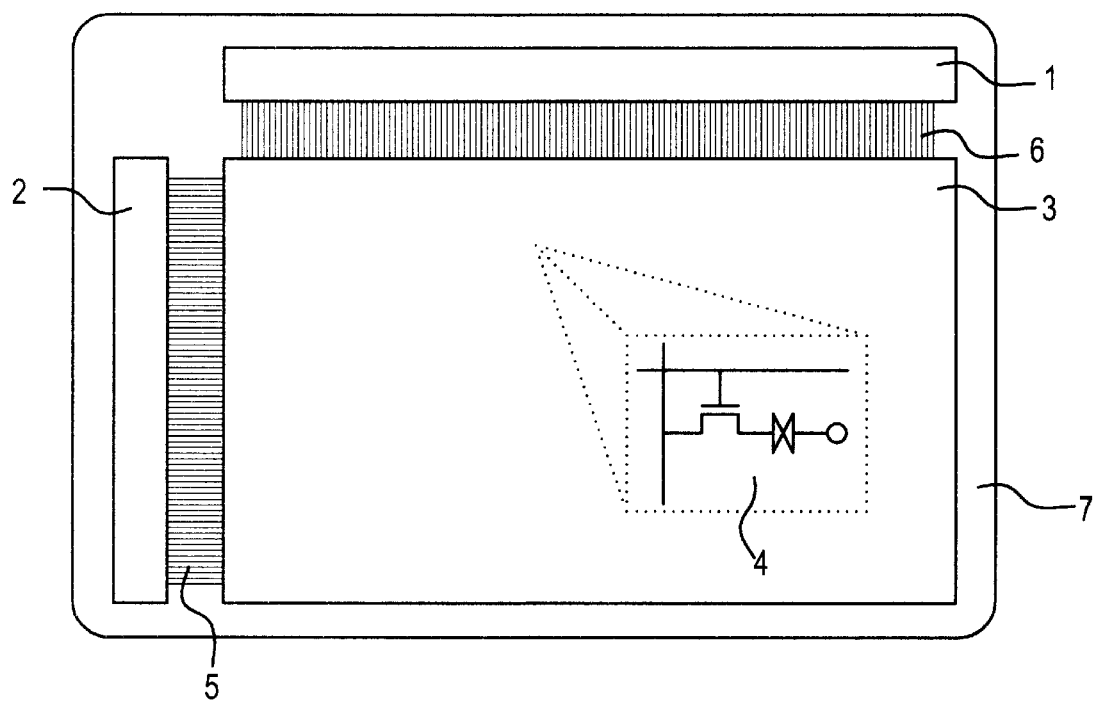
FIG. 10 shows an example of a configuration of a monolithic active matrix circuit.

FIGS. 8A to 8E show manufacturing steps according to the embodiment. The two TFTs on the left side of the figures are TFTs provided in the peripheral driving circuits (which correspond to the regions 1 and 2 in FIG. 10) and the one TFT on the right side is a TFT provided in the matrix region (which corresponds to the region 3 in FIG. 10).

Figure 8A:
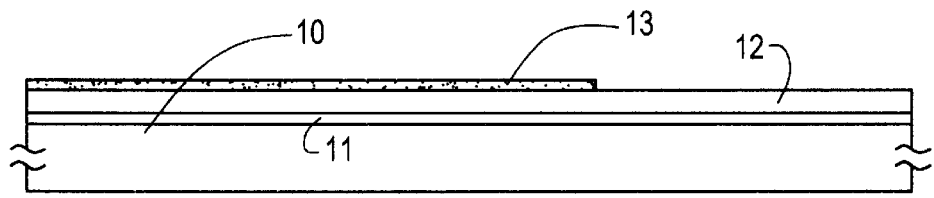
FIGS. 8A to 8E show manufacturing steps according to an embodiment.

After a base layer 11 of silicon oxide having a thickness of 2000 Å is formed on a substrate (Corning 7059) 10, an intrinsic (I-type) amorphous silicon film 12 is deposited to a thickness of 500 to 1500 Å, e.g. 500 Å using plasma CVD or low pressure thermal CVD. Subsequently, an extremely thin silicon film (the thickness is 5 to 200 Å, e.g., 50 Å) 13 containing nickel at a concentration of $1\times10^{19}$ cm$^{-3}$ is selectively formed using sputtering. The selective formation of the silicon film 13 can be performed using sputtering and lift-off processes. Thus, nickel elements are selectively introduced into the amorphous silicon film (FIG. 8A).

Although an example has been described wherein nickel elements are introduced using a silicon film containing nickel, nickel may be introduced into the amorphous silicon film using other methods such as adding a solution containing nickel (nickel acetate solution or the like may be used) to the surface of the amorphous silicon film.

Figure 8B:
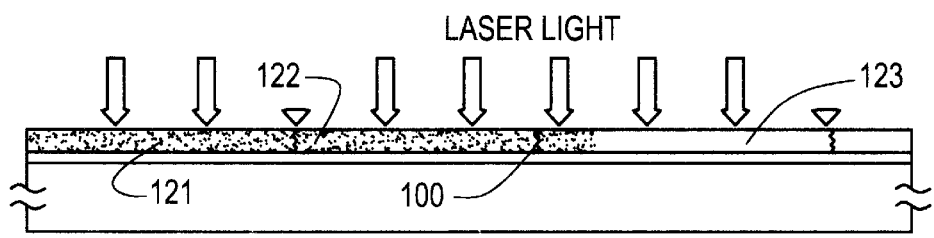

The amorphous silicon film 12 is crystallized as shown in FIG. 8B by irradiating the entire surface of the amorphous silicon film 12 with laser light. The laser light is irradiated using a KrF excimer laser (having a wavelength of 248 nm and a pulse width of 20 ns). When the laser irradiation is performed, the sample is heated to 550° C. Methods for heating the sample include a method wherein a heating element is provided in a substrate holder for holding the substrate and then the sample is heated by heating this substrate holder, and a method wherein the sample is heated by infrared light irradiation.

The laser light may include a XeF excimer laser (having a wavelength of 353 nm), a XeCl excimer laser (having a wavelength of 308 nm), or an ArF excimer laser (having a wavelength of 193 nm). The energy density of the laser is 200 to 500 mJ/cm$^2$, e.g., 350 mJ/cm$^2$, and the required number of shots for one location is 2 to 10, e.g., 2 shots. The laser irradiation allows the entire surface of the amorphous silicon film to be crystallized. During this crystallization, a multiplicity of monodomain regions 121 to 123 are formed.

The monodomain regions 121 and 122 are somewhat different from the monodomain region 123. While the regions 121 and 122 are more like single crystal silicon because they have less defects as a result of the action of nickel, the region 123 has a larger number of defects. These monodomain regions are adjacent to each other through a grain boundary 100.

Figure 12A:
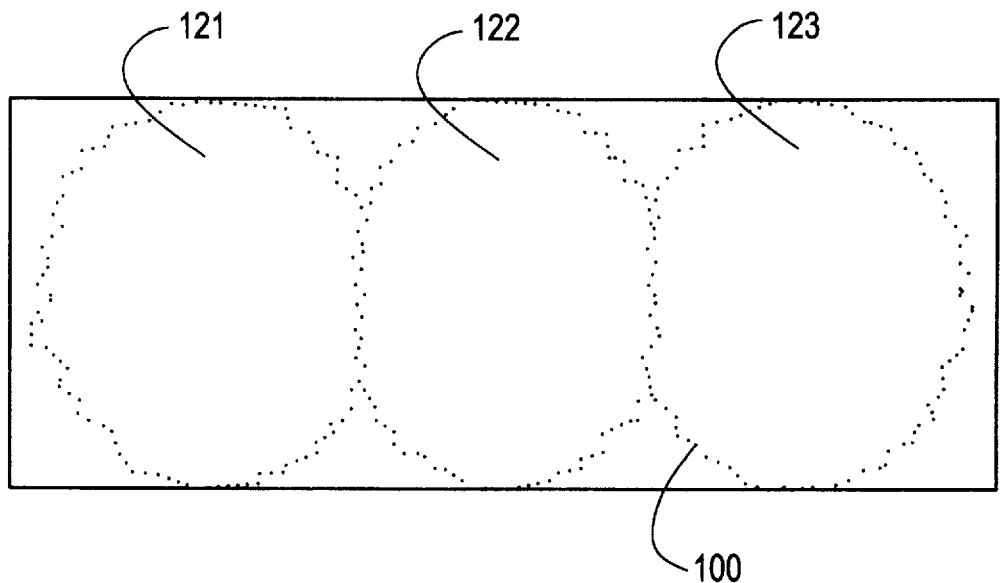
FIG. 12A and FIG. 12B show the relationship between active layers and monodomain regions of a TFT.

FIG. 12A is shows the state shown in FIG. 8B as viewed from the upper side. FIG. 12A shows the monodomain regions 121 to 123. The silicon film thus obtained is patterned using photolithography to form island-like silicon regions 141, 142 (peripheral driving circuit regions) and 143 (matrix region) which serve as active layers. At least a channel forming region must be formed in the monodomain regions. Also, it is preferable that the active layer that forms each TFT is constituted by one monodomain region.

Figure 8C:
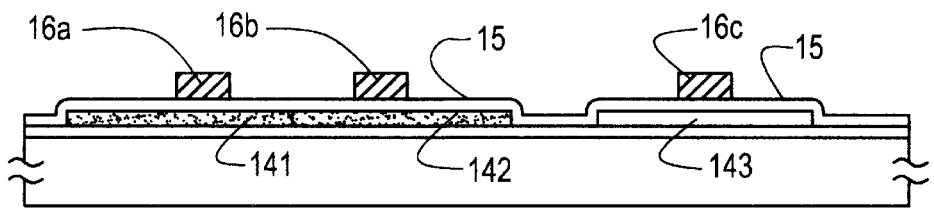
Figure 12B:
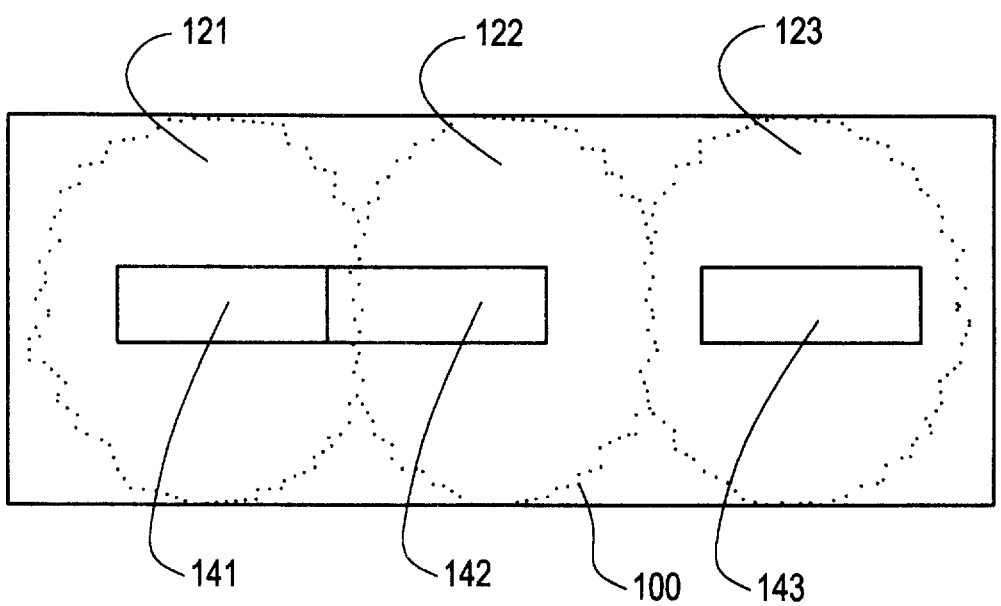
Figure 13A:
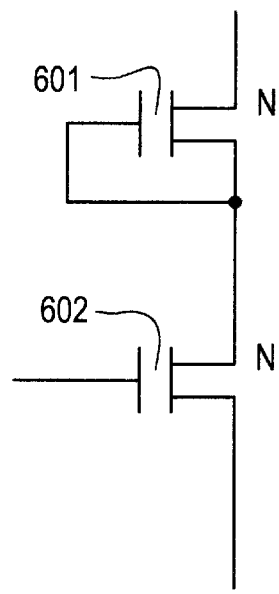
FIG. 13A and FIG. 13B show examples of an inverter circuit constituting a peripheral driving circuit.
Figure 13B:
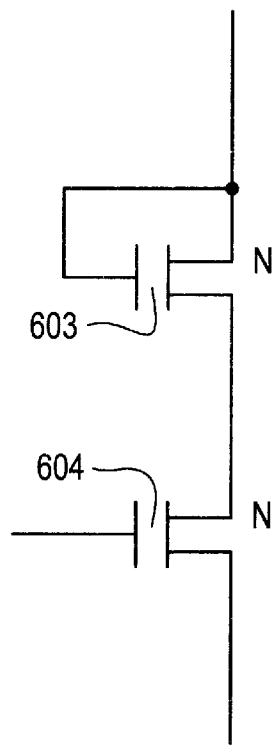

FIG. 12B shows the positional relationship between the monodomain regions and the active layers (island-like silicon regions). In FIG. 12B, the island-like silicon regions 141 to 143 constituting the active layers are generally configured inside the respective monodomain regions 121 to 123. Also, sputtering is performed to deposit a silicon oxide film 15 having a thickness of 1000 Å as a gate insulation film, using silicon oxide as the target at a substrate temperature of 400° to 400° C., e.g., 350° C., in an atmosphere containing oxygen and argon, the ratio of argon to oxygen being in 0 to 0.5, e.g., 0.1 or less. Subsequently, low pressure thermal CVD is performed to deposit a silicon film (containing 0.1–2% phosphorus) having a thickness of 3000 to 8000 Å, e.g., 6000 Å. The processes of forming the silicon oxide 15 and the silicon film are preferably performed in succession. Then, the silicon film is patterned to form gate electrodes 16a, 16b, and 16c (FIG. 8C).

Plasma doping is performed to implant impurities (phosphorus and boron) into the silicon region using the gate electrodes as a mask. Phosphine (PH$_3$) and diborane (B$_2$H$_6$) are used as the doping gas. The acceleration voltage is 60 to 90 kV, e.g., 80 kV for phosphorus and 40 to 80 kV, e.g., 65 kV for boron. The dose is $1\times10^{15}$ to $8\times10^{15}$ cm$^{-2}$, e.g., $2\times10^{15}$ cm$^{-2}$ for phosphorus and $5\times10^{15}$ cm$^{-2}$ for boron. As a result, an N-type impurity region 17a and P-type impurity regions 17b and 17c are formed.

Figure 8D:
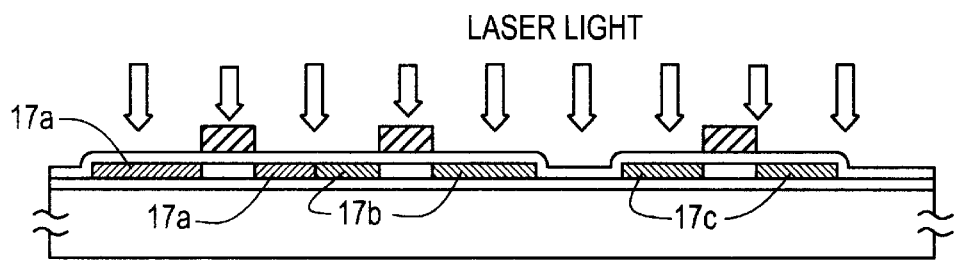

Thereafter, laser irradiation is performed to activate the impurities. The laser light are irradiated using a KrF excimer laser (having a wavelength of 248 nm and a pulse width of 20 ns). Alternatively, the laser light may be irradiated using a XeF excimer laser (having a wavelength of 353 nm), a XeCl excimer laser (having a wavelength of 308 nm), or an ArF excimer laser (having a wavelength of 193 nm). The energy density of the laser is 200 to 400 mJ/cm$^2$, e.g., 250 mJ/cm$^2$, and the required number of shots for one location is 2 to 10, e.g., 2 shots. Further, the substrate is heated to 100° to 450° C., e.g., 250° C. when the laser irradiation is performed. Thus, the impurity regions 17a to 17c are activated (FIG. 8D).

It is effective to heat the sample to 450° to 750° C., preferably 500° to 600° C. when the impurity regions 17a to 17c are irradiated by laser light to be activated. This allows the activation of the impurity regions 17a to 17c to be carried out more effectively.

Figure 8E:
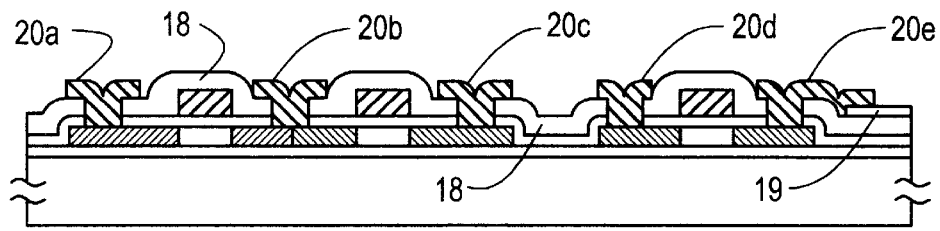

Subsequently, a silicon oxide film 18 having a thickness of 6000 Å is formed as an interlayer insulator using plasma CVD. Also, sputtering is performed to form an indium tin oxide (ITO) film having a thickness of 500 to 1000 Å, e.g., 800 Å which is then patterned to form a pixel electrode 10. Contact holes are formed in the interlayer insulator to form electrode-wirings 20a, 20b, and 20c for the TFTs of the peripheral driving circuits and electrodes-wirings 20d and 20e for the TFT for the matrix pixel circuit using a multilayer film made of metals such as titanium nitride and aluminum. Finally, annealing is performed at 350° C. in a hydrogen atmosphere of 1 atmosphere pressure for 30 minutes to complete a semiconductor circuit (FIG. 8E).

As a result of an analysis on the concentration of the nickel included in the active region of the TFTs obtained according to the embodiment by using secondary ion mass spectrometry (SIMS), nickel is detected at a concentration of $1\times10^{17}$ to $5\times10^{17}$ cm$^{-3}$ from the TFTs in the peripheral driving circuit regions (two TFT in left side constructed by P-channel and N-channel types) and at a concentration of the limit of measurement ($1\times10^{16}$ cm$^{-3}$) or less from the TFT of the pixel circuit.

The two TFTs for the peripheral circuit regions located on the left in the embodiment have less defects in the active layers thereof and have high mobility and is capable of passing a high ON current therethrough. Since the active region of TFT for the pixel region shown on the right includes nickel at a low concentration of the limit of measurement or less, it is possible to decrease an OFF current originating from the presence of nickel atoms. It is thought that nickel atoms act as a trap center for carriers, causing an increase in the OFF current.

Fifth Embodiment

Figure 9A:
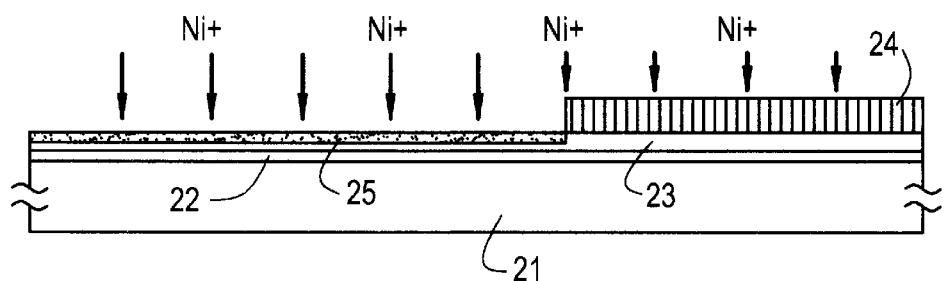
FIGS. 9A to 9E show manufacturing steps according to an embodiment.

FIGS. 9A to 9E show manufacturing steps according to the present embodiment. After forming a 2000 Å thick silicon oxide film 22 on a substrate (Corning 7059) 21 using sputtering, plasma CVD or low pressure thermal CVD is performed to deposit an amorphous silicon film 23 having a thickness of 200 to 1500 Å, e.g., 500 Å. Nickel ions are selectively implanted using an ion implantation with amorphous silicon film 23 masked by a photoresist 24. A region 25 is formed which contains nickel at a concentration of $1\times10^{15}$ to $1\times10^{18}$ cm$^{-3}$, e.g., $5\times10^{16}$ cm$^{-3}$. The depth of the region 25 is 200 to 500 Å, and the acceleration energy is chosen to be optimum accordingly. When ion implantation is used as in the embodiment, the concentration of nickel can be more easily controlled than in the first embodiment (FIG. 9A).

The substrate is heated in a nitrogen atmosphere for two hours at 450° to 600° C., e.g., 550° C. As a result of this heating process, preparatory crystallization occurs preliminarily in the region doped with nickel. That is, crystal nuclei are formed during this heating process which facilitate the growth of monodomain regions.

Figure 9B:
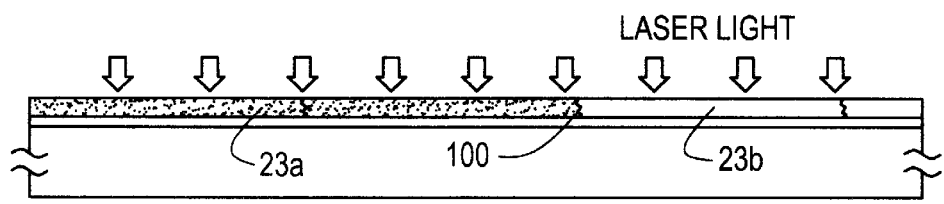

The entire surface of the amorphous silicon film 23 is irradiated by laser light with the sample heated to 550° C. to crystallize that region. The laser light are irradiated using a KrF excimer laser (having a wavelength of 248 nm and a pulse width of 20 ns). The energy density of the laser is 200 to 500 mJ/cm$^2$, e.g., 350 mJ/cm$^2$, and the number of shots for one location is 2 to 10, e.g., 2 shots (FIG. 9B).

As a result, the silicon film is crystallized and a multiplicity of monodomain regions are formed. Adjacent monodomain regions are separated by a grain boundary 100. Among the monodomain regions thus obtained, a monodomain region 23a can be obtained with crystallinity higher than that of a region 23b. More specifically, the monodomain region 23a can have a crystal structure having less defects than that of the monodomain region 23b. However, the concentration of the nickel elements in the monodomain region 23a is much higher than that of the nickel elements in the monodomain region 23b.

This silicon film is patterned to form island-like regions 26a (the peripheral driving circuit region) and 26b (the matrix pixel element region). Further, plasma CVD is performed to form a 1000 Å thick silicon oxide film 27 from tetraethoxysilane (Si(OC$_2$HS)$_4$, TEOS) and oxygen as a gate insulating film for the TFTs.

Subsequently, sputtering is performed to deposit an aluminum film (containing 0.2% silicon or scandium) to a thickness of 6000 to 8000 Å, e.g., 6000 Å. Instead of aluminum, tantalum, tungsten, titanium, or molybdenum may be used. The processes of forming the silicon oxide film 27 and the aluminum film are preferably performed in accession.

Figure 9C:
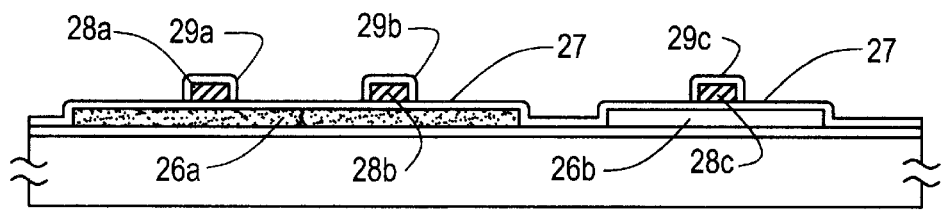

The aluminum film is patterned to form gate electrodes 28a, 28b, and 28c of the TFTs. The surface of the aluminum wirings is anodized to form oxide layers 29a, 29b, and 29c having a thickness of 2000 Å. The anodization is carried out in an ethylene glycol solution including 1–5% tartaric acid (FIG. 9C).

Plasma doping is performed to implant an impurity (phosphorus) into the silicon region. The doping gas is phosphine (PH$_3$) The acceleration voltage is 60 to 90 kV, e.g., 80 kV. The dose is $1\times10^{15}$ to $8\times10^{15}$ cm$^{-2}$, e.g., $2\times10^{15}$ cm$^{-2}$. As a result, an N-type impurity region 30a is formed. Also, the TFT on the left (N-channel type TFT) is masked with a photoresist, and then plasma doping is performed again to implant an impurity (boron) into the silicon regions of the TFT (P-channel type TFT) in the peripheral circuit region on the right and the TFT in the matrix region. In this case, the doping gas is diborane (B$_2$H$_6$). The acceleration voltage is 50 to 80 kV, e.g., 65 kV. The dose is $1\times10^{15}$ to $8\times10^{15}$ cm$^{-2}$, e.g., $5\times10^{15}$ cm$^{-2}$ which is larger than that of phosphorus implanted earlier. Thus, P-type impurity regions 30b and 30c are formed.

Figure 9D:
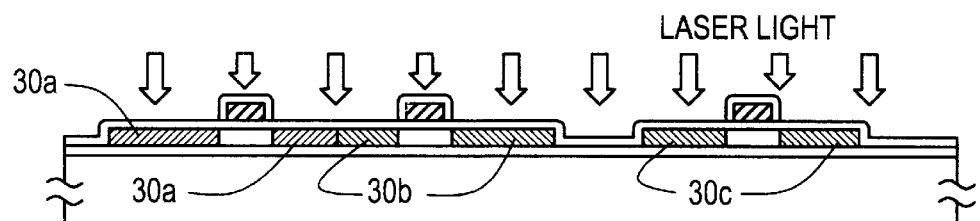

Laser annealing is performed to activate the impurities. The laser light is irradiated using a KrF excimer laser (having a wavelength of 248 nm and a pulse width of 20 ns). The energy density of the laser is 200 to 400 mJ/cm$^2$, e.g., 250 mJ/cm$^2$, and the number of shots for one location is 2 to 10, e.g., 2 shots (FIG. 9D).

Figure 9E:
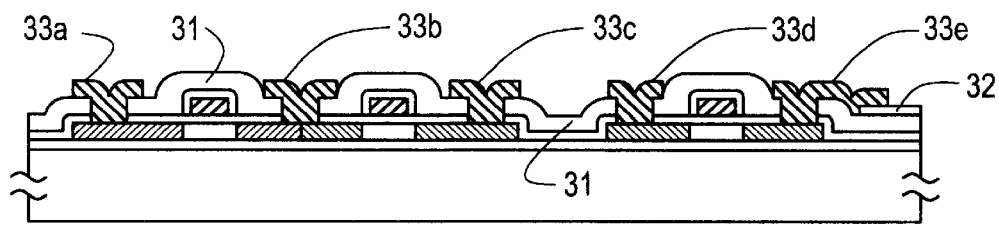

Plasma CVD is performed using TEOS as the raw material to form a 2000 Å thick silicon oxide film 31 as an interlayer insulator, and then sputtering is performed to deposit an indium tin oxide (ITO) film having a thickness of 500 to 1000 Å, e.g., 800 Å which is then etched to form a pixel electrode 32. Contact holes are formed in the interlayer insulator 31 to form source/drain electrode-wirings 33a, 33b, and 33c for the TFTs of the peripheral driving circuits and electrode-wirings 33d and 33e for the TFT for the pixel circuit, using a multilayer film made of metals such as titanium nitride and aluminum. The above processes complete a semiconductor circuit (FIG. 9E).

In the semiconductor circuit thus fabricated, the TFTs for the peripheral driving circuit regions (the two TFTs on the left in the figure) have higher mobility and is capable of passing a high ON current therethrough, and the TFT provided in the matrix region (the one on the right in the figure) is a TFT which can not handle an ON current as high as that handled by the TFTs in the peripheral driver circuit regions but which is characterized in that the OFF current is relatively small.

Sixth Embodiment

In the embodiment, TFTs having desired characteristics are selectively provided by introducing metal elements that promote crystallization into an amorphous silicon film at different concentrations. Especially, in an active matrix type liquid crystal display device, metal elements (nickel is used in the embodiment) are introduced into the peripheral driving circuit regions at a higher concentration and the metal elements are introduced into the matrix region at a lower concentration.

FIGS. 11A to 11E show the embodiment. The two TFTs on the left are circuits constituting the peripheral circuit regions configured on a complementary type, and the TFT on the right in the figures is a switching TFT provided in the matrix region constituted by a plurality of pixels.

Figure 11A:
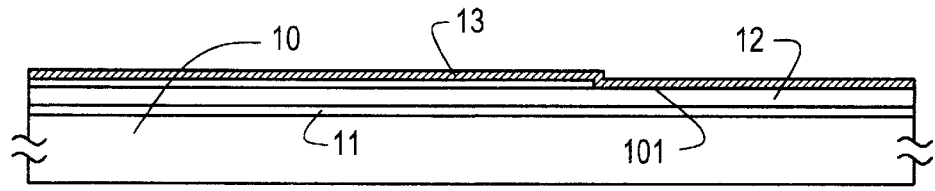
FIGS. 11A to 11E show manufacturing steps according to an embodiment.

After forming a 2000 Å thick silicon oxide film 11 on a glass substrate 10 using sputtering as a base film, plasma CVD or low pressure thermal CVD is performed to form an amorphous silicon film having a thickness of 500 Å. Then, a thin film 13 including nickel at a high concentration is selectively formed on the surface of the amorphous silicon film 12 and a film 101 including nickel at a lower concentration is formed (FIG. 11A).

In this case, a nickel silicide film including nickel at a concentration of $1 \times 10^{18}$ cm$^{-3}$ is used as the film 13 including nickel at a higher concentration, and a nickel silicide film including nickel at a concentration of $8 \times 10^{16}$ cm$^{-3}$ is used as the film 101 including nickel at a lower concentration. The thickness of the nickel silicide film is on the order of several tens Å.

This arrangement makes it possible to selectively introduce nickel into the amorphous silicon film at different concentrations. The sample is irradiated by laser light in a state wherein it is heated to 550° C. to crystallize the amorphous silicon film 12. Thus, monodomain regions 12a and 12b are obtained.

The monodomain region 12a includes nickel at a concentration higher than that in the monodomain region 12b. Further, the region 12a has less point defects. Therefore, the region 12a is a region suitable for the formation of a TFT which has high mobility and is capable of passing a high ON current therethrough. On the other hand, since the region 12b includes nickel at a lower concentration, this region is suitable for the formation of a TFT having low OFF current characteristics as a result of the limited mobility.

Figure 11B:
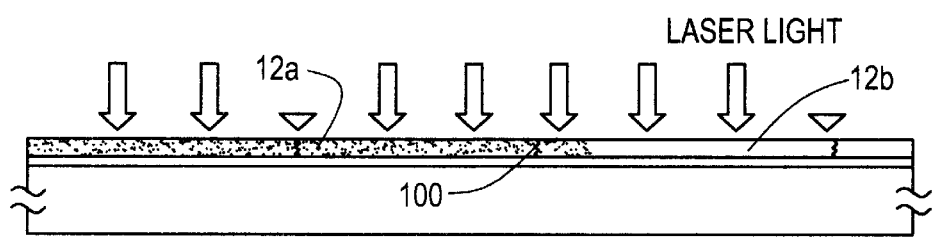
Figure 11C:
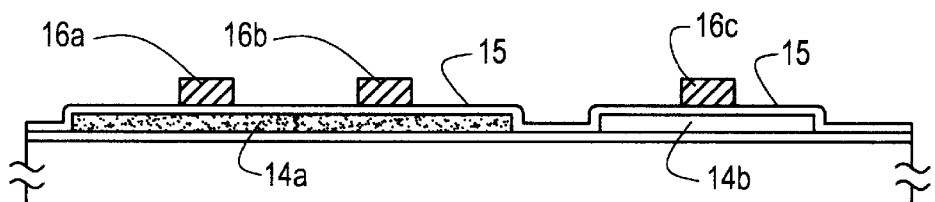
Figure 11D:
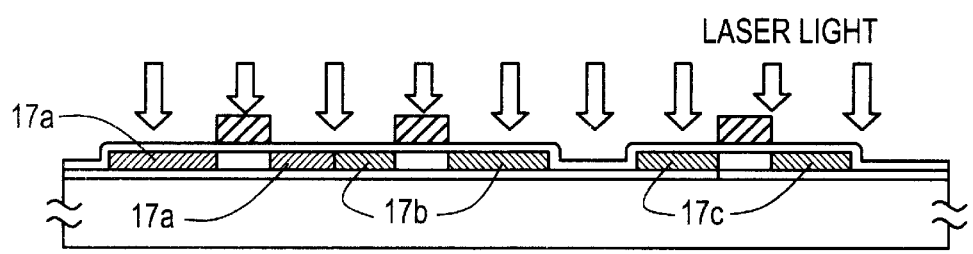
Figure 11E:
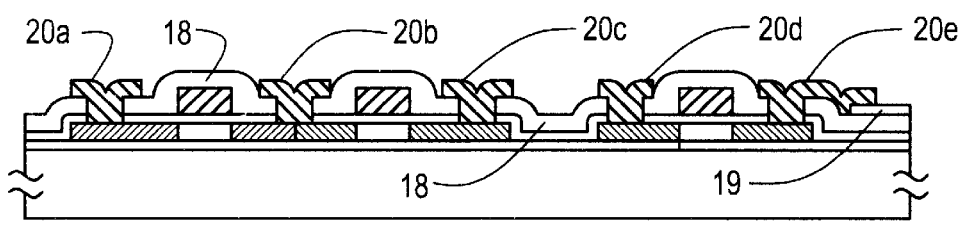

After the plurality of monodomain regions as shown in FIG. 11B are formed, processes similar to those shown in FIG. 8C and the subsequent processes are performed to complete the circuit.

The present invention makes it possible to form crystalline silicon TFTs capable of a high speed operation and amorphous silicon TFTs characterized by a low OFF current on the same substrate. The application of the present invention to liquid crystal displays will improve the productivity and characteristics thereof. Thus, the present invention is advantageous from the industrial point of view.

What is claimed is:

1. A method for forming a semiconductor circuit for an electro-optical device, said method comprising the steps of:

forming an amorphous semiconductor film on a substrate having an insulating surface;

selectively introducing a metal element on a first portion of said amorphous semiconductor film while said metal element is not introduced on a second portion of said amorphous semiconductor film, said metal element being capable of promoting crystallization of said semiconductor film;

heating said amorphous semiconductor film at a temperature in the range of 450°–750° C. during irradiating whole surface of said amorphous semiconductor film with a light to crystallize said amorphous semiconductor film so that at least said first portion of said crystallized semiconductor film includes no grain boundary therein;

forming an active matrix circuit in said second portion of said crystallized semiconductor film; and forming a peripheral driving circuit in said first portion of said crystallized semiconductor film.

2. A method according to claim 1 wherein the metal element comprises at least one selected from the group consisting of Fe, Co, Ni, Ru, Rh, Pd, Os, Ir, Pt, Cu, Ag, Au.

3. A method for forming a semiconductor circuit for an electro-optical device, said method comprising the steps of:

forming an amorphous semiconductor film on a substrate having an insulating surface;

selectively introducing a metal element on a first portion of said amorphous semiconductor film while said metal element is not introduced on a second portion of said amorphous semiconductor film, said metal element being capable of promoting crystallization of said semiconductor film;

irradiating whole surface of said amorphous semiconductor film with a light to crystallize said amorphous semiconductor film, so that at least said first portion of said crystallized semiconductor film includes no grain boundary therein;

forming an active matrix circuit in said second portion of said crystallized semiconductor film; and forming a peripheral driving circuit in said first portion of said crystallized semiconductor film, wherein said semiconductor film includes carbon and nitrogen at a concentration of $1 \times 10^{16}$ to $5 \times 10^{18}$ cm$^{-3}$ and oxygen at a concentration of $1 \times 10^{17}$ to $5 \times 10^{19}$ cm$^{-3}$.

4. A method according to claim 3 wherein the metal element comprises at least one selected from the group consisting of Fe, Co, Ni, Ru, Rh, Pd, Os, Ir, Pt, Cu, Ag, Au.

5. A method for forming a semiconductor circuit for an electro-optical device said method comprising the steps of:

forming an amorphous semiconductor film on a substrate having an insulating surface;

selectively introducing a metal element into a first portion of said amorphous semiconductor film while said metal element is not introduced into a second portion of said amorphous semiconductor film said metal element being capable of promoting crystallization of said semiconductor film;

heating said amorphous semiconductor film at a temperature in the range of 450°–750° C. during irradiating whole surface of said amorphous semiconductor film to crystallize said amorphous semiconductor film, so that at least said first portion of said crystallized semiconductor film includes no grain boundary therein;

forming an active matrix circuit in said second portion of said crystallized semiconductor film; and forming a peripheral driving circuit in said first portion of said crystallized semiconductor film, wherein said semiconductor film includes carbon and nitrogen at a concentration of $1 \times 10^{16}$ to $5 \times 10^{18}$ cm$^{-3}$, and oxygen at a concentration of $1 \times 10^{17}$ to $5 \times 10^{19}$ cm$^{-3}$.

6. A method according to claim 5 wherein the metal element comprises at least one selected from the group consisting of Fe, Co, Ni, Ru, Rh, Pd, Os, Ir, Pt, Cu, Ag, Au.

7. A method for forming a semiconductor circuit for an electro-optical device, said method comprising the steps of:

forming an amorphous semiconductor film on a substrate having an insulating surface;

introducing a metal element into a first portion of said amorphous semiconductor film at a first concentration while said metal element is introduced into a second portion of said amorphous semiconductor film at a second concentration, said first concentration being higher than said second concentration;

heating said amorphous semiconductor film at a temperature in the range of 450°–750° C. during irradiating whole surface of said amorphous semiconductor film to crystallize said amorphous semiconductor film, so that said first and second portions of said crystallized semiconductor film include no grain boundary therein;

forming an active matrix circuit in said second portion of said crystallized semiconductor film; and forming a peripheral driving circuit in said first portion of said crystallized semiconductor film.

8. A method according to claim 7 wherein the metal element comprises at least one selected from the group consisting of Fe, Co, Ni, Ru, Rh, Pd, Os, Ir, Pt, Cu, Ag, Au.

9. A method according to claim 1 wherein said semiconductor film is a silicon film.

10. A method according to claim 1 wherein said first portion of the crystallized semiconductor film including no grain boundary therein is a monodomain region.

11. A method according to claim 3 wherein said semiconductor film is a silicon film.

12. A method according to claim 3 wherein said first portion of the crystallized semiconductor film including no grain boundary therein is a monodomain region.

13. A method according to claim 5 wherein said semiconductor film is a silicon film.

14. A method according to claim 5 wherein said first portion of the crystallized semiconductor film including no grain boundary therein is a monodomain region.

15. A method according to claim 7 wherein said semiconductor film is a silicon film.

16. A method according to claim 7 wherein each of said first and second portions of the crystallized semiconductor film including no grain boundary therein is a monodomain region.

17. A method according to claim 1 wherein said metal element is selectively introduced by forming a metal film comprising said metal element on said first portion of the amorphous semiconductor film.

18. A method according to claim 1 wherein said metal element is selectively introduced by adding a solution comprising said metal element on said first portion of the amorphous semiconductor film.

19. A method of fabricating a semiconductor device comprising the steps of:

forming an amorphous semiconductor film on an insulating surface;

introducing a metal element adjacent to said amorphous semiconductor film, said metal element being capable of promoting crystallization of said amorphous semiconductor film; and heating said amorphous semiconductor film at a temperature in the range of 450°–750° C. during irradiating whole surface of said amorphous semiconductor film with a light to crystallize said amorphous semiconductor film so that said crystallized semiconductor film includes no grain boundary therein.

20. A method according to claim 19 wherein said semiconductor film includes carbon and nitrogen at a concentration of $1 \times 10^{16}$ to $5 \times 10^{18}$ cm$^{-3}$, and oxygen at a concentration of $1 \times 10^{17}$ to $5 \times 10^{19}$ cm$^{-3}$.

21. A method according to claim 19 wherein said metal element comprises at least one selected from the group consisting of Fe, Co, Ni, Ru, Rh, Pd, Os, Ir, Pt, Cu, Ag, Au.

22. A method according to claim 19 wherein said semiconductor film is a silicon film.

* * * * *